United States Patent [19]
Mouri et al.

[11] Patent Number: 5,533,452
[45] Date of Patent: Jul. 9, 1996

[54] METHOD OF PEELING A RELEASE FILM FROM A PHOTOSENSITIVE PLATE BLANK

[75] Inventors: Akihiro Mouri, Kokubunji; Tsuyoshi Shibata; Yuji Kondo, both of Yokohama, all of Japan

[73] Assignee: Canon Kabushiki Kaisha, Tokyo, Japan

[21] Appl. No.: 334,105

[22] Filed: Nov. 4, 1994

Related U.S. Application Data

[63] Continuation of Ser. No. 58,688, May 10, 1993, abandoned, which is a continuation of Ser. No. 792,698, Nov. 15, 1991, abandoned.

[30] Foreign Application Priority Data

Nov. 19, 1990 [JP] Japan ...................... 2-313592

[51] Int. Cl.⁶ .................... B41N 1/14; G03C 1/805
[52] U.S. Cl. ................. 101/463.1; 101/467; 430/302; 430/253; 430/254; 430/260
[58] Field of Search ............. 101/450.1, 451, 101/452, 463.1, 465, 466, 467; 430/302, 303, 309, 253, 254, 255, 258, 260; 156/215, 344

[56] References Cited

U.S. PATENT DOCUMENTS

| | | | |
|---|---|---|---|
| 2,756,143 | 7/1956 | Murray | 101/467 X |
| 3,517,613 | 6/1970 | Schinke et al. | 101/142 |
| 3,554,125 | 1/1971 | Van Dorn | 101/467 X |
| 4,123,274 | 10/1978 | Knight et al. | 430/336 |
| 4,220,709 | 9/1980 | de Mauriac | 430/353 |
| 4,374,691 | 2/1983 | Vanden Bergh | 101/467 X |
| 4,985,346 | 1/1991 | Suzuki | 430/253 X |
| 5,028,511 | 7/1991 | Choi | 430/253 X |
| 5,073,791 | 12/1991 | Mouri et al. | 355/27 |

FOREIGN PATENT DOCUMENTS

| | | |
|---|---|---|
| 53882 | 3/1983 | Japan. |
| 58-118639 | 7/1983 | Japan. |
| 58-118638 | 7/1983 | Japan. |
| 59-181341 | 10/1984 | Japan. |
| 60-69650 | 4/1985 | Japan. |
| 60-225151 | 11/1985 | Japan. |
| 1-267093 | 10/1989 | Japan. |
| 1-269593 | 10/1989 | Japan. |
| 1-306855 | 12/1989 | Japan. |
| 1-306856 | 12/1989 | Japan. |
| 2-72 | 1/1990 | Japan. |
| 2-80472 | 3/1990 | Japan. |
| 2-107678 | 4/1990 | Japan. |
| 2-110119 | 4/1990 | Japan. |
| 2-105873 | 4/1990 | Japan. |
| 5550246 | 4/1990 | Japan. |
| 2-238935 | 9/1990 | Japan. |

*Primary Examiner*—Stephen Funk
*Attorney, Agent, or Firm*—Fitzpatrick, Cella, Harper & Scinto

[57] ABSTRACT

A printing method for an in situ plate production process in which a photosensitive plate blank having a polymerization layer between a support and a release film is fixed to a plate cylinder either before or after forming a polymerization-nonpolymerization pattern in the polymerization layer. The polymerization layer can be a thermal development-type photosensitive layer for forming the pattern. The release film is then peeled apart from the plate blank to leave a printing plate on the plate cylinder, which can be used for printing and for an inking step. The printing pattern of the plate can be formed by selective removal of the unpolymerized part or by selective transfer of the release film to the polymerized part of the polymerization layer.

16 Claims, 5 Drawing Sheets

METHOD OF PEELING A RELEASE FILM FROM A PHOTOSENSITIVE PLATE BLANK

This application is a continuation, of application Ser. No. 08/058,688 filed May 10, 1993, now abandoned, which is a continuation of application Ser. No. 07/792,698 filed Nov. 15, 1991, now abandoned.

FIELD OF THE INVENTION AND RELATED ART

The present invention relates to a printing method including a plate production process.

Hitherto, there has been a process known for producing a printing plate wherein a photoresist layer as in a PS (pre-sensitized) plate is exposed to light from a light source, such as a mercury lamp, through a mask, such as a lith-type film and then etched with a developer to form a plate. Difficulties occur in this process however in that the use of a solvent accompanying the developing treatment causes troublesome processing and there is the necessity of disposal of the waste liquid.

A peeling development process has been proposed in order to solve the difficulty. In the peeling development process, a photo-polymerization layer containing a photo-polymerization initiator is selectively exposed to light of a wavelength corresponding to the photo-polymerization initiator to result in a difference in relative adhesiveness to a first support and a second support between the exposed part and the un-exposed part and, by utilizing the difference, the second support is peeled off from the first support together with the unexposed part of the photo-polymerization layer after the exposure to form a resist image with the exposed part of the photo-polymerization layer on the first support. This method does not involve a wet treatment using a solvent and therefore provides a printing plate relatively easily.

As a photosensitive plate blank for providing a printing plate through the peeling development process, there is, for example, one known which comprises a thermal development-type-photosensitive composition layer comprising a silver salt, etc., a peeling-development-type photopolymerizable composition layer, a release film, and a support as disclosed in Japanese Laid-Open Patent Application (JP-A) 50246/1980. The thermal development-type composition is used for image formation through photo-exposure and heating.

In the conventional peeling development process described above, a mechanism is used exclusively for peeling the second support together with the un-polymerized part of the photo-polymerization layer from the first support, and the peeling mechanism and a printer body are independently co-present, so that the entire printer apparatus is liable to be large and complicated. Further, the printing plate thus formed is then wound about a cylinder, so that the plate is liable to be damaged or stained which results in inferior images.

Also our research group has proposed an image forming method using the peeling development process wherein pixels are formed in a shape allowing smooth peeling separation between the first and second supports (U.S. patent application Ser. No. 741,769, filed Aug. 7, 1991).

Our research group has also proposed an image forming apparatus for forming an image comprising a polymerized part and an un-polymerized part in a layer comprising a polymerizable polymer precursor (U.S. patent application Ser. No. 558,639, filed Jul. 27, 1990) issued as U.S. Pat. No. 5,073,791, Dec. 12, 1991.

SUMMARY OF THE INVENTION

An object of the present invention is to provide a printing method wherein a mar- or stain-free plate is provided and used to obtain clear printed products.

According to the present invention, a printing method is provided comprising the steps of:

providing a photosensitive printing plate blank comprising a polymerization layer between a support and a release film, affixing the plate blank about a plate cylinder, forming a pattern of a polymerized part and an unpolymerized part in the polymerization layer, peeling the release film apart from the plate blank to leave a printing plate on the plate cylinder, and perform printing by using the printing plate.

According to the present invention, a printing method is further provided comprising the steps of:

providing a photosensitive printing plate blank comprising a polymerization layer having a pattern of a polymerized part and an unpolymerized part between a support and a release film, affixing the plate blank about a plate cylinder, peeling the release film apart from the plate blank to leave a printing plate on the plate cylinder, and perform printing by using the printing plate.

These and other objects, features and advantages of the present invention will become more apparent upon a consideration of the following description of the preferred embodiments of the present invention taken in conjunction with the accompanying drawings wherein like reference numerals are used to denote like parts.

DETAILED DESCRIPTION OF THE INVENTION

In the printing method according to the present invention, a photosensitive plate blank including a release film is used. In the present invention, the plate blank is affixed to a plate cylinder of a printing apparatus, and the release film is removed, while it is on the plate cylinder, to form a printing plate having a printing image pattern, followed by printing.

Figure 1:
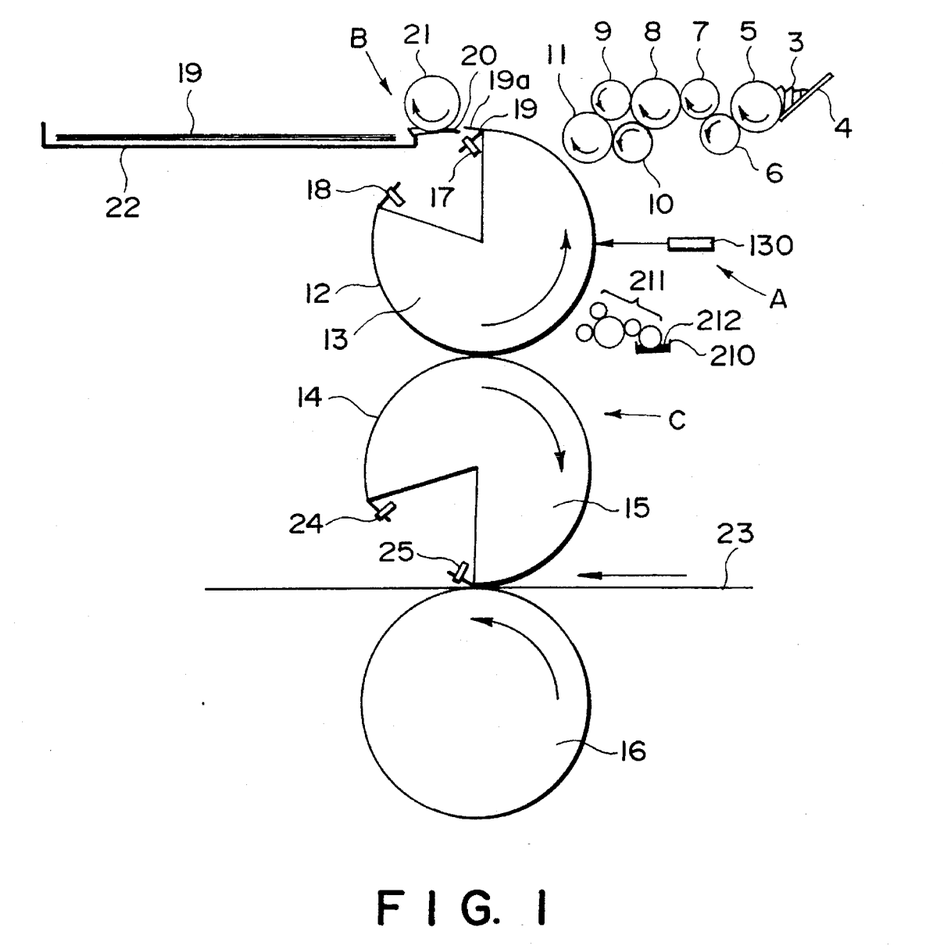
FIG. 1 is a side view of a printing apparatus for practicing the printing method according to the present invention.

FIG. 1 shows a printing apparatus, which is used for practicing the printing method according to the present invention and principally comprises a printing image forming station (or unit) A, a peeling station (or unit) B and a printing station (or unit) C, of which the printing image forming unit A can be omitted as the case may be.

The printing image forming unit A is used for forming a printing image pattern in a photosensitive plate blank 12 affixed about the peripheral surface of a plate cylinder 13. The printing image pattern includes, e.g., a hydrophilic part and a water-repellent part, or an ink attaching part and an ink non-attaching part.

The printing image forming unit A is principally composed of an optical system comprising an optical unit 130. The optical unit 130 includes a light source, such as a laser inclusive of a semiconductor laser, a mercury lamp or a fluorescent lamp. In order to write such a printing image pattern in the photosensitive plate blank 12 on the plate cylinder 13, the plate blank 12 may be exposed imagewise to a scanning light beam from an optical unit 130 issued depending on input signal from a digital signal source or to image light through a photomask from an optical unit 130. The plate cylinder 13 is provided with affixing chucks 17 and 18 for attaching the plate blank 12 about the cylinder 13. The plate cylinder 13 may be a known one preferably having a diameter of about 60–100 mm.

Figure 2:
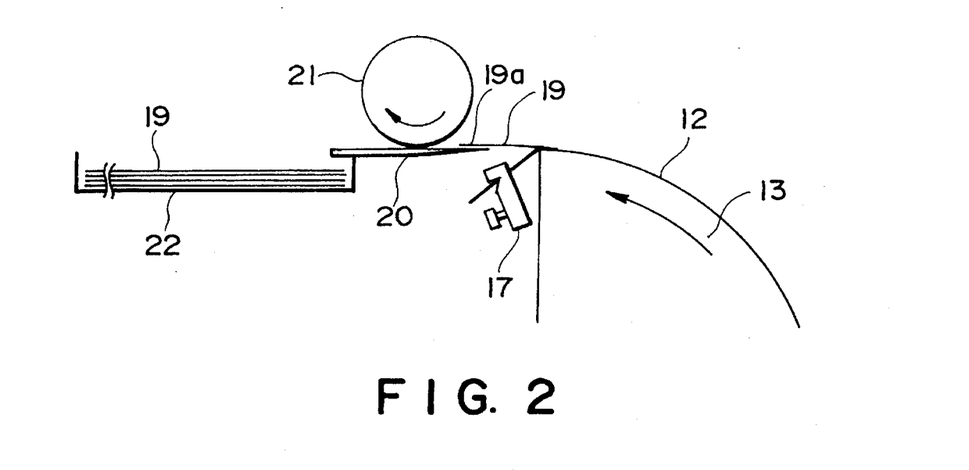
FIG. 2 is an enlarged partial view of the peeling station of the printing apparatus shown in FIG. 1.

The peeling unit B is used for peeling a release film 19 on the plate blank 12, e.g., by the action of a separation guide 20 and a conveying roller 21 as better illustrated in FIG. 2. The peeled release film 19 is sent into a recovery tray 22. The peeling unit B may preferably include a peeling position detecting sensor (not shown) for detecting that the leading end of the photosensitive plate blank 12 has reached the peeling station B and also a release film detecting sensor (not shown) for detecting that the release film 19 has been completely separated.

The printing unit C includes an inking unit and a recording unit. The inking unit is used for supplying an ink 3 to a printing plate having a printing image pattern and may comprise, e.g., an ink-carrying roller 5 equipped with an ink formation blade 4, thickness-regulating rollers 6–10, and an ink supply roller 11 for supplying the ink 3 onto the printing plate.

The inking unit is so arranged that it is separated from the system, e.g., particularly the plate cylinder 13, while the printing image forming unit A and the peeling unit B are in operation, i.e., so as not to supply the ink 3 to the plate blank 12.

The recording unit is so constructed as to transfer the ink 3 onto a recording material 23, such as paper, depending on an image pattern on the plate and comprises, e.g., the plate cylinder 13 about which the plate blank 12 is affixed, a blanket cylinder 15 about which a blanket is affixed and an impression cylinder 16.

The blanket 14 and the blanket cylinder 15 are disposed as desired but can be omitted for the purpose of printing. The blanket 14 may comprise, e.g., an about 2 mm-thick layer of a rubber, such as urethane rubber or ethylene-propylene rubber, which may preferably contain reinforcing fiber therein so as to reduce the deformation thereof. The blanket cylinder 15 may preferably comprise, e.g., an about 60 to 100 mm-dia. cylinder of a metal, such as aluminum or stainless steel, and may be equipped with chucks 24 and 25 for affixing the blanket 14. In this embodiment, the plate cylinder 13, blanket cylinder 15 and impression cylinder 16 are constituted to have identical diameters and be driven in identical peripheral speeds in association with each other by means of gears (not shown).

The printing unit C may be provided with a dampening water supply unit, as desired, including a dampening water fountain 210 and plural dampening water supply rollers 211 as shown in FIG. 1 so that dampening water 212 in the fountain 210 is supplied onto the printing plate by means of the rollers 211. As has been well known heretofore, the dampening water may be used in the case where the printing image pattern on the plate is composed of a hydrophillic part and a water-repellent part. The dampening water supply unit, similarly as the inking unit, is separated from the plate cylinder 13, while the printing image forming unit A and the peeling unit B are in operation, so as not to supply dampening water to the plate blank.

Figure 7:
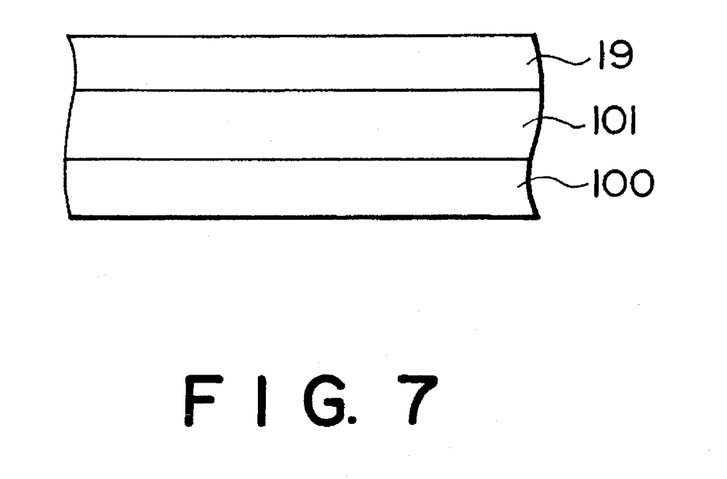
FIG. 7 is a side view of an example of the photosensitive plate blank used in the printing method according to the invention.

As shown in FIG. 7, the photosensitive plate blank 12 may include a layer 101 comprising a polymerizable polymer precursor and a photo-polymerization initiator and capable of causing photo-polymerization (hereinafter referred to as "polymerization layer") between a support 100 and a release film 19. In the plate blank 12, a pattern of polymerization and non-polymerization is formed depending on imagewise exposure, which pattern may be peeled apart together with the release film. More specifically, when the release film is peeled from the support 100, the non-polymerized part in the polymerization layer may be removed together with the release film to leave the polymerized pattern, which constitutes a printing plate together with the support remaining on the plate cylinder.

Alternatively, a non-peeling-apart type photosensitive plate as described below may also be used.

More specifically, it is possible to use a photosensitive plate blank of the type (hereinafter referred to as the "surface reforming-type plate blank") wherein a pattern of polymerization and non-polymerization is formed in the polymerization layer 101 and then a release film 19 is peeled apart therefrom to leave both the polymerized part and the non-polymerized part on the support 100 without causing separation between these parts. Some property of the release film 19 is preferentially transferred to the surface of the polymerized part in the polymerization layer after the peeling of the release film 19. Accordingly, if a hydrophillic or water-repellent release film 19 is used, a hydrophilicity-water-repellency pattern usable as a printing image pattern may be formed corresponding to the polymerization-non-polymerization pattern.

Examples of the polymerizable polymer precursor contained in the polymerization layer 101 may include, for example:

monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether;

difunctional monomers such as divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), β,β'-dimethylglutaric acid di(ethyl methacrylate), 1,4-phenylenebis(oxyethyl methacrylate), and 1,4-bis(methacryloyloxyethoxy)cyclohexane acryloyloxyethoxyethyl vinyl ether;

trifunctional monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product pattern 1,1,1-trimethylolpropane and three-fold moles of hexanediisocyanate, with p-hydroxystyrene; and tetrafunctional monomers such as ethylenetetraacrylamide, and propylenetetraacrylamide. Two or more of these polymerizable polymer precursors can be used in combination.

The photopolymerization initiator contained in the polymerization layer 101 may include, for example, carbonyl compounds, sulfur compounds, halogen compounds, photopolymerization initiators of redox type, and peroxide initiators sensitized with dye such as pyrilium.

Specifically, the carbonyl compounds include diketones as exemplified by phenyl, 4,4'-dimethoxybenzyl, diacetyl, and camphorquinone; benzophenones as exemplified by 4,4'-bis(diethylamino)benzophenone, and 4,4'-dimethoxylbenzophenone; acetophenones as exemplified by acetophenone, and 4-methoxyacetophenone; benzoin alkyl ethers; thioxanthones as exemplified by 2-chlorothioxanthone, 2,4-dichlorothixanthone, 2,4-diethylthioxanthone, and thioxanthone-3-carboxylic acid-β-methoxy ethyl ester; chalcones and styrylketones having a dialkylamino group; and cumarins as exemplified by 3,3'-carbonylbis(7-methoxycumarin), and 3,3'-carbonylbis(7-diethylaminocumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photo-polymerization reaction.

Such combination of the photopolymerization initiators includes a combination of styryl ketones or chalcones having a dialkylamino group or cumarins, with S-triazines having a trihalomethyl group or camphorquinone.

Figure 6:
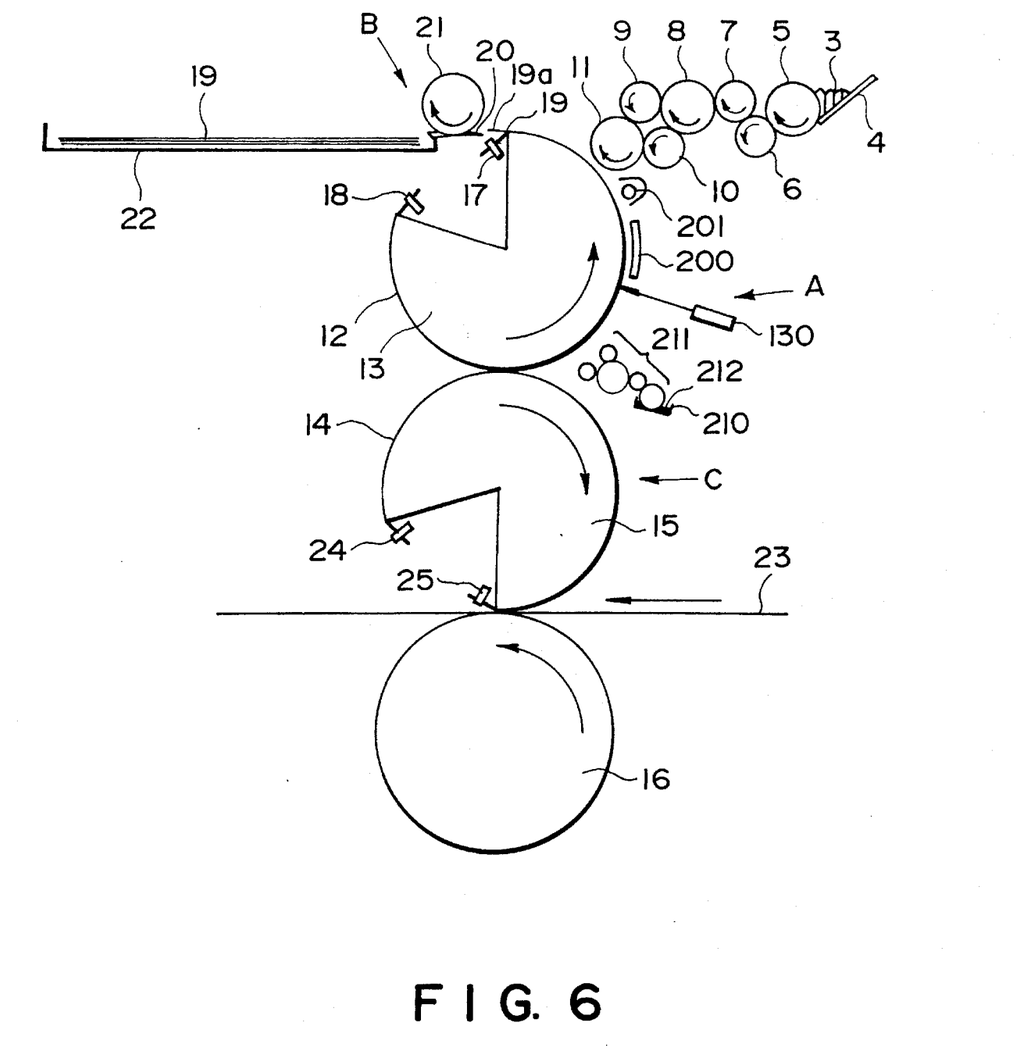
FIG. 6 is a side view showing another example of the printing apparatus for practicing the printing method according to the invention.

The polymerization layer 101 can further contain a photosensitive silver salt, an organic silver salt and a reducing agent in addition to the polymerizable polymer precursor and the photo-polymerization initiator so as to form a polymerization layer of a thermal development type. In this case, a polymerization-non-polymerization pattern is formed in the polymerization layer 101 by subjecting the polymerization layer 101 to heating (thermal development) and exposure for polymerization (polymerization exposure) after the imagewise exposure. Accordingly, in the case of using such a photosensitive plate blank including a thermal development-type polymerization layer, it is preferred to dispose a heater 200 for thermal development after the imagewise exposure by the optical unit 130 and a light source 201 for polymerization exposure after the thermal development, respectively, around the plate cylinder 13.

The polymerization layer of the thermal development type may be one in which the imagewise exposed part is caused to have a higher degree of polymerization or a lower degree of polymerization than the non-exposed part depending on the kind of reducing agent contained therein, of which the latter type provides a better contrast of polymerization-nonpolymerization pattern.

As described above, the imagewise non-exposed part may be provided with a higher degree of polymerization than the imagewise exposed part by selecting the reducing agent. This is because, at the imagewise exposed part, the organic silver salt and the reducing agent causes an oxidation-reduction reaction with each other to form an oxidation product (of the reducing agent) showing a light-absorptivity. More specifically, at the imagewise exposed part containing the oxidation product, light of a specific wavelength is absorbed by the oxidation product so that polymerization is not substantially caused whereas, at the imagewise non-exposed part containing no oxidation product, the light is substantially absorbed to cause the polymerization. In this way, a polymerization-nonpolymerization pattern is formed in a polymerization layer of the thermal development type.

Incidentally, the silver halide results in silver nuclei after imagewise exposure, which silver nuclei function as a catalyst for the oxidation-reduction between the organic silver salt and the reducing agent. Thus, the silver nuclei form a latent image.

The silver halide contained in the thermal development-type polymerization layer may be a known silver halide used in photography, etc., such as silver chloride, silver bromide, silver iodide, silver chlorobromide, silver iodochloride, silver iodobromide, or silver chloroiodobromide.

The halogen content in the silver halide particles may be uniform or ununiform from the surface to the core. The silver halide particles may have a particle size of preferably 0.001–10 microns, further preferably 0.001–5 microns.

The photosensitive silver salt may be or may have been subjected to chemical sensitization or optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing dyes, such as cyanine dyes and merocyanine dyes.

The organic silver salt that can be used in the medium of the present invention may include, for example, silver salts of aliphatic carboxylic acids, aromatic carboxylic acids, mercapto or thiocarbonyl compounds having an $\alpha$-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid. In general., however, silver salts are less stable as they have a smaller number of carbon atoms, and hence those having an appropriate number of carbon atoms, e.g., 16 to 26 carbon atoms, are preferred.

The aromatic carboxylic acids include benzoic acid derivatives, quinolinic acid derivatives, naphthalenecarboxylic acid derivatives, salicylic acid derivatives, gallic acid, tannic acid, phthalic acid, phenylacetic acid derivatives, and pyromellitic acid.

The mercapto or thiocarbonyl compounds include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 22), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication JP-B 44-30271 or JP-B 42-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Laid-Open Patent Application JP-A 58-118638, sulfobenzotriazole, carboxybenzotriazole or salts thereof, or hydroxybenzotriazole, described in Japanese Laid-Open Patent Application JP-A 58-118639, 1,2,4-triazole, described in U.S. Pat. No. 4,220, 709, or 1H-tetrazole, carbazole, saccharin, imidazole, and derivatives thereof.

The reducing agent may be one which causes a redox reaction under heating with an organic silver salt in the presence of a silver latent image from the photosensitive silver salt as catalyst to produce a silver image absorbing light in the absorption wavelength range of the photopolymerization layer to reduce the transmitted light quantity, or one which results in an oxidized product through a similar redox reaction absorbing light in the absorption wavelength range of the photopolymerization initiator.

More specifically, examples of the reducing agent usable in the present invention may include reducing agents disclosed in "SHASHIN KOGAKU NO KISO, HIGIN-EN HEN (Basis of Photolithographic Industry, Volume of Non-silver Salt)" p. 250 - , primary color developing agents, and secondary color developing agents. Specific examples thereof may include: phenols, hydroquinones, catechols, p-aminophenol, p-substituted aminophenols, p-phenylenediamines, 3-pyrazolidones; in addition, resorcines, pyrogallols, o-aminophenols, m-aminophenols, m-phenylenediamines, 5-pyrazolones, alkylphenols, alkoxyphenols, naphthols, aminonaphtols, naphtholenediols, alkoxynaphthols, hydrazines, hydrazones, hydroxychromane-hydroxycoumarans, sulfonamidophenols, aminonaphthols, ascorbic acid and its derivatives, hydroxyindanes, bisphenols and orthobisphenols.

Further, leuco bases obtained by reducing a class of dyes may also be used as a reducing agent.

It is further possible to use two or more species of the above-mentioned reducing agents in combination. When a secondary color developing agent is used, it may preferably be used in combination with a coupler which reacts with an oxidation product of the secondary color developing agent to form a light-absorbing compound.

Specific examples of the reducing agent may include: hydroquinone, hydroquinone monomethyl ether, 2,4-dimethyl-6-t-butylphenol, catechol, dichlorocatechol, 2-methylcatechol, methyl gallate, ethyl gallate, o-aminophenol, 3,5-dimethyl-2-aminophenol, p-aminophenol, p-amino-o-methylphenol, m-dimethylaminophenol, m-diethylaminophenyl, 2,6-dicyclohexyl-4-methylphenol, 1-naphthol, 2-methyl-1-naphthol, 2,4-dichloro-1-naphthol, 1,1-di-2-naphthol, 2,2'-methylenebis(4-methyl-6-t-butylphenol), 2,2'-methylenebis(4-ethyl-6-t-butylphenol), 2,2'-butylidenebis(4-methyl-6-t-butylphenol), 4,4'-butylidenebis(3-methyl-6-t-butylphenol), 4,4'-methylenebis(2,6-di-t-butylphenol), 1,1,3-tris(2-methyl-4-hydroxy-5-t-butylphenol)butane, 4,4'-thiobis(3-methyl-6-t-butylphenol, 2,4-bis(ethylthio)-6-(4-hydroxy-3,5-di-t-butylanilino)-1,3, 5-triazine, 2,4-bis(octylthio)-6-(4-hydroxy-3,5-di-t-butylanilino)-1,3,5-triazine, 2,6-dichloro-4-benzenesulfonamidophenol, 2-chloro-4-benzenesulfonamidophenol, 2,6-dibromo-4-benzenesulfonamidophenol, thioindoxyl, indoxyl, 1,3-dimethylpyrogallol, 4-methoxynaphthol, 4-ethoxynaphthol, 2-cyanoacetylcoumarone, N,N-dimethylphenylenediamine, N,N-diethylphenylenediamine and N'N'-diethyl-3-methylphenylenediamine.

Further, examples of the coupler used in combination with a secondary color developing agent (of, e.g., the phenylenediamine-type or p-aminophenol-type) may include: 1-hydroxy-N-butyl-2-naphthamide, benzoylacetone, benzoylacetanilide, o-methoxybenzoyl-aceto-o-methoxyanilide, dibenzoylmethane, 2-chloro-1naphthol, 2,6-dibromo-1,5-naphthalenediol, and 3-methyl-1-phenylpyrazolone.

The light-absorptive oxidation product may be one classified or not classified under the category of colorants or dyes, if it substantially attenuates the sensitivity of the photopolymerization initiator. In case where absorption in the ultraviolet range for example is utilized, absorption in the visible range is not questioned.

As for the combination of the light-absorptive oxidation product and the photopolymerization initiator, when 4,4'-methylenebis(2-methyl-6-t-butylphenol), 4,4'-methylenebis(2,6-di-t-butylphenol) or the like, for example, is used as a reducing agent, it is possible to use a photopolymerization initiator having a sensitivity to 380–390 nm, such as 2-chlorothioxanthone, 2-methylthioxanthone, 2,4-dimethylthioxanthone, 2,4,6-trimethylbenzoyldiphenylphosphine oxide, and benzyl.

Further, 2,6-di-tert-butyl-4-benzylphenol, 1-(3,5-di-t-butyl-4-hydroxyphenyl)-1-phenylethane or a secondary color developing agent forming a cyane colorant may be used in combination with a photopolymerization initiator having a sensitivity to 300–370 nm in addition to the visible region, such as 1-phenyl-2-hydroxy-2-methylpropane-1-one, 1-hydroxycyclohexyl phenyl ketone, benzoin dimethyl ether, benzophenone, and 4-benzoyl-4'-methyldiphenyl sulfide.

In addition to the above-mentioned components, the polymerization layer 101 can further contain an optional component, such as a binder or film-forming agent, a color-adjusting agent, a fog-preventing agent, a photo-color denaturation-preventing agent, a solid solvent, a surfactant, or an anti-static agent.

The binder or film-forming agent usable in the polymerization layer may include, for example: cellulose esters, such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate; cellulose ethers, such as methyl cellulose, ethyl cellulose, propyl cellulose, and butyl cellulose; vinyl resins, such as polystyrene, polyvinyl chloride, polyvinyl acetate, polyvinyl butyral, polyvinyl acetal, polyvinyl alcohol, and polyvinyl pyrrolidone; copolymer resins, such as a styrene/butadiene copolymer, a styrene/acrylonitrile copolymer, a styrene/butadiene/acrylonitrile copolymer, and a vinyl chloride/vinyl acetate copolymer; acrylic resins, such as polymethyl methacrylate, polymethyl acrylate, polybutyl acrylate, polyacrylic acid, polymethacrylic acid, polyacrylamide, and polyacrylonitrile; polyesters, such as polyethylene terephthalate; polyarylate resins, such as poly(4,4'-isopropylidene, diphenylene-co-1,4-cyclohexylenedimethylene carbonate), poly(ethylenedioxy-3,3'-phenylene thiocarbonate), poly(4,4'-isopropylidene, diphenylene carbonate-co-terephthalate), poly(4,4'-isopropylidene,diphenylene carbonate), poly(4,4'-sec-butylidene,diphenylene carbonate), and poly(4,4'-isopropylidene,diphenylene carbonate-block-oxyethylene); polyamides; polyimides; epoxy resins; phenolic resins; polyolefins, such as polyethylene, polypropylene, and chlorinated polyethylene; and natural polymers, such as gelatin.

Figure 8:
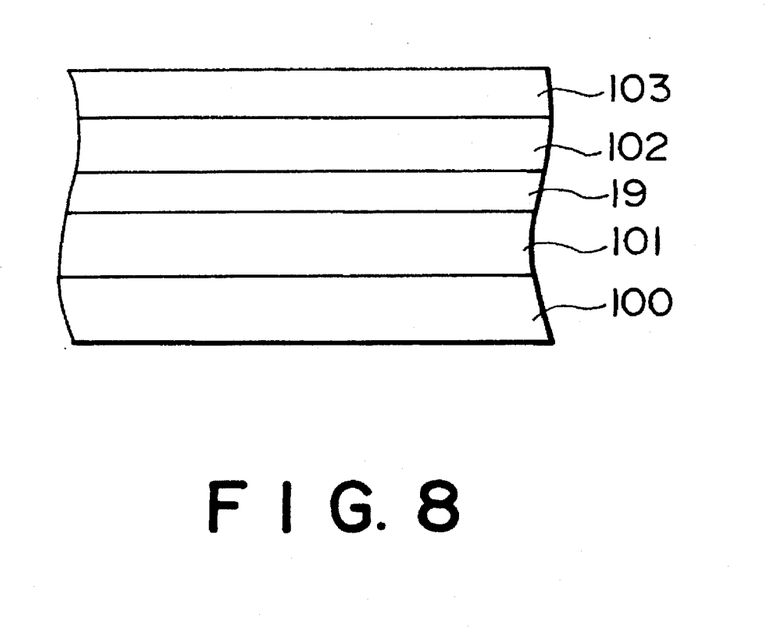
FIG. 8 is a side view of another example of the photosensitive plate blank used in the printing method according to the invention.

Further, it is also possible to use a polymerization layer 101 containing no silver halide, organic silver salt or reducing agent in combination with a separate thermal development-type photosensitive layer. In this case, it is suitable to dispose a thermal development-type photosensitive layer 102 on a release film 19 as shown in FIG. 8 so that the thermal development-type photosensitive layer 102 can be removed together with the release film 19 when the release film 19 is peeled off from the support 100. In the embodiment shown in FIG. 8, a protective film 103 for protecting the thermal development-type photosensitive layer 102 is disposed on the photosensitive layer 102.

The support 100, release film 19 and the protective film 103 may be composed of a resin appropriately selected from various plastics or resins, such as polyethylene terephthalate, polypropylene, cellophane, polyimide, 6,6-nylon, polystyrene, polyvinyl alcohol, and polyvinyl butyral.

The release film used in the surface-reforming type plate blank can comprise various materials depending on the nature of surface reforming. For example, in order to impart a lipophilicity or water-repelling property to the surface of the polymeric layer, the release film may comprise a resin having a low surface energy, inclusive of: fluorine-containing resins, such as polytetrafluoroethylene, tetrafluoroethylene-perfluoroalkyl vinyl ether copolymer, tetrafluoroethylene-ethylene copolymer, and poly-chlorotrifluoroethylene; and silicone resins. The release film may be formed as a film of such a resin or a coating layer of such a resin formed by applying a solution thereof in an appropriate solvent onto an appropriate substrate such as a polyethylene terephthalate film.

In order to impart a hydrophilicity or water-retaining property to the surface of the polymeric layer, the release film may comprise a hydrophilic polymer, inclusive of: plant polymers, such as guar gum, locust bean gum, gum arabic, tragacanth, carrageenan, pectin, mannan, and starch; microorganism polymers, such as xanthane gum, dextrin, succinoglucan, and curdran; animal polymers, such as gelatin, casein, albumin, and collagen; cellulose polymers such as methyl cellulose, ethyl cellulose, and hydroxyethyl cellulose; starch polymers, such as soluble starch, carboxymethyl starch, and methyl starch; alginic acid polymers, such as propylene glycol alginate, and alginic acid salts; other semisynthetic polymers, such as derivatives of polysaccharides; vinyl polymers, such as polyvinyl alcohol, polyvinylpyrolidone, polyvinyl methyl ether, carboxyvinyl polymer, sodium polyacrylate, and polyacrylamide; and other synthetic polymers, such as polyethylene glycol, ethylene oxide-propylene oxide block copolymer; mixture of above polymers with additives, silicon dioxide, titanium dioxide, crosslinking agents and surfactants; hydrophilic polymers as disclosed in Japanese Patent Publication (JP-B) 15383/1990 and Japanese Laid-Open Patent Applications (JP-A) 80472/1990, 105873/1990, 238935/1989, 110119/1990, 107678/1990 and 72/1990; resins which per are hydrophobic but can have hydrophilic groups through hydrolysis or hydrogenolysis in contact with an etchant or dampening water; and resins disclosed in JP-A 306856/1989, 306855/1989, 267093/1989 and 269593/1989. These resins may be used singly or in combination of two or more species.

The polymerizable polymer precursor may be contained in a proportion of 5–99 wt. %, preferably 10–80 wt. %, further preferably 20–60 wt. % of the polymerization layer 101. The photo-polymerization initiator may preferably be contained in a proportion of 0.1–30 wt. parts, particularly 0.3–25 wt. parts, per 100 wt. parts of the polymerizable polymer precursor.

In the case where the photosensitive plate blank contains a photosensitive silver halide, an organic silver salt and a reducing agent, the organic silver salt may suitably be used at a rate of 0.3–30 g/m$^2$, preferably 0.7–15 g/m$^2$, further preferably 1.2–8 g/m$^2$. Further, the photosensitive silver salt may suitably be used in a proportion of 0.001–2 mols, preferably 0.05–0.4 mol, per 1 mol of the organic silver salt. The reducing agent may suitably be used in a proportion of 0.05–3 mols, preferably 0.2–1.3 mols, per 1 mol of the organic silver salt.

The polymerization layer 101 may preferably have a thickness of 0.2–100 microns, particularly 0.5–50 microns.

The thermal development-type polymerization layer 101 may preferably have a thickness of 0.2 micron–2 mm, particularly 1 micron–0.5 mm.

The thermal development-type photosensitive layer 102 may preferably have a thickness of 0.1 micron–2 mm, particularly 1 micron–0.2 mm.

The photosensitive plate blank 12 can be provided with a peeling end for facilitating the initiation of the peeling operation as shown in JP-A 181341/1984, JP-A 69650/1985 and JP-A 225151/1985.

Figure 3:
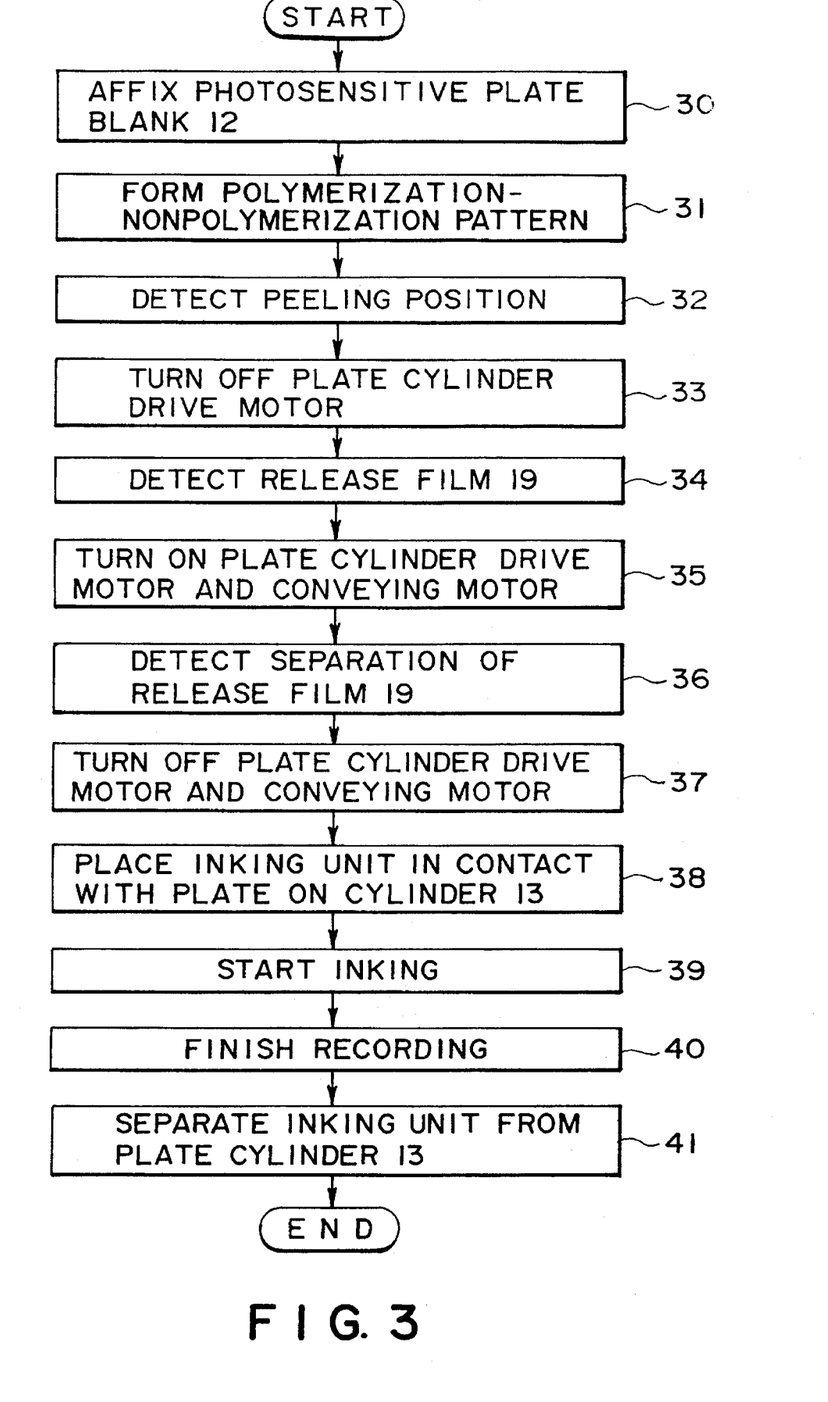
FIG. 3 is a flow chart showing an embodiment of operation of the printing method according to the invention.

The printing method according to the present invention may be performed by using a photosensitive plate blank as described above in the following manner with primary reference to FIG. 1 and a flow chart shown in FIG. 3.

First, a photosensitive plate blank 12 is fixed about a plate cylinder 13 by means of affixing chucks 17 and 18 (step 30).

The chucks may be in any form as far as they can affix the plate blank 12 about the plate cylinder 13. At this time, the release film 19 in the plate blank 12 is set free from the affixing by the chucks 17 and 18. The affixing of the plate blank 12 may be performed either manually or automatically by utilizing the rotation of the plate cylinder 13 in the direction of an indicated arrow.

After affixing the photosensitive plate blank 12, a polymerization-nonpolymerization pattern is formed in the polymerization layer 101 of the plate blank 12 along with the rotation of the plate cylinder 13 in the arrow direction in a printing image forming step (step 31). The polymerization-nonpolymerization pattern is formed by using an optical unit 130. In the case of using a printing plate blank having a thermal development-type polymerization layer or a thermal development-type photosensitive layer (hereinafter inclusively referred to as a "thermal development-type plate blank"), the polymerization-nonpolymerization pattern is formed by an optical unit 130, a heater 200 and a light source 201 as shown in FIG. 6.

When the leading end of the plate blank 12 reaches the peeling position, the reaching is detected by a peeling position-detection sensor (not shown) and a plate cylinder drive motor is turned off to stop the plate cylinder 13 (steps 32 and 33).

When the plate cylinder 13 is stopped, if a release film-detecting sensor (not shown) detects a state that the leading end 19a of the release film 19 is held by a separation guide 20, the plate cylinder drive motor and a conveying motor (not shown) are turned on to drive the plate cylinder 13 and a conveying roller 21 (steps 34 and 35). The leading end 19a of the release film 19 may preferably be disposed un-attached to the polymerization layer 101, so that the leading end 19a of the release film 19 is separated from the plate blank 12 when the plate blank 12 is affixed to the plate cylinder 13 as shown in FIG. 1.

In a peeling step, the release film 19 is inserted between the separation guide 20 and the conveying roller 21 due to the rotation of the plate cylinder 13 and further removed from the plate blank 12 due to the rotation of the plate cylinder 13 and the conveying roller 21 to be recovered in a recovery tray 22.

When the release film-detecting sensor detects a state that the release film 19 is completely peeled apart, the plate cylinder drive motor and the conveying motor are turned off to stop the plate cylinder 13 and the conveying motor (steps 36 and 37). The peripheral speeds of the plate cylinder 13 and the conveying roller 21 for peeling-apart of the release film 19 can vary depending on the plate blank used but may preferably be within the range of 10–100 mm/sec. At the time of the peeling, the peripheral speed of the conveying roller 21 may preferably be equal to or larger than that of the plate cylinder 13. Through the above-mentioned peeling step, a printing plate suitable for inking is formed on the plate cylinder 13..

In a printing step after the completion of the peeling step, the rotation speed of the plate cylinder 13 is increased and the inking unit is caused to contact the printing plate on the cylinder 13 (step 38), and an ink is supplied to the, plate (step 39). Further, similarly as the inking unit, a dampening water supply unit is also caused to contact the printing plate as desired.

In the printing step, the plate cylinder 13 may preferably be rotated at a peripheral speed of 100–1000 mm/sec.

The ink on the plate is transferred to a blanket 14 and then transferred to recording paper 23 to form an image thereon under a pressure exerted by an impression cylinder 16.

After completion of the printing on a number of sheets of the recording paper 23, the inking unit and the dampening water supply unit are separated from the plate cylinder 13 (steps 40 and 41).

The above explanation is made to an embodiment wherein the photosensitive plate blank 12 is affixed to the plate cylinder 13 and then a printing image pattern is formed in the plate blank 12. It is however also possible to affix a plate blank 12 already having a printing image pattern but still covered with a release film 19 onto the plate cylinder 13 and perform the method from the step 32 shown in the flowchart of FIG. 3. Further, in the case of using a thermal development-type plate blank, it is also possible to use a plate blank having a latent image after the imagewise exposure and thermal development and affix the plate blank about the plate cylinder 13 for the polymerization exposure.

In the printing image forming step, a light quantity up to about 500 mJ/cm$^2$ on a plate blank may suitably be used for the imagewise exposure of a non-thermal development-type plate blank or the polymerization exposure of a thermal development-type plate blank. Further, a light quantity of up to about 1 mJ/cm$^2$ on the plate blank may be used for the imagewise exposure of the thermal development-type plate blank. The thermal development of the thermal development-type plate blank may suitably be effected at a temperature of 80°–160° C. for 3–20 seconds.

Figure 4:
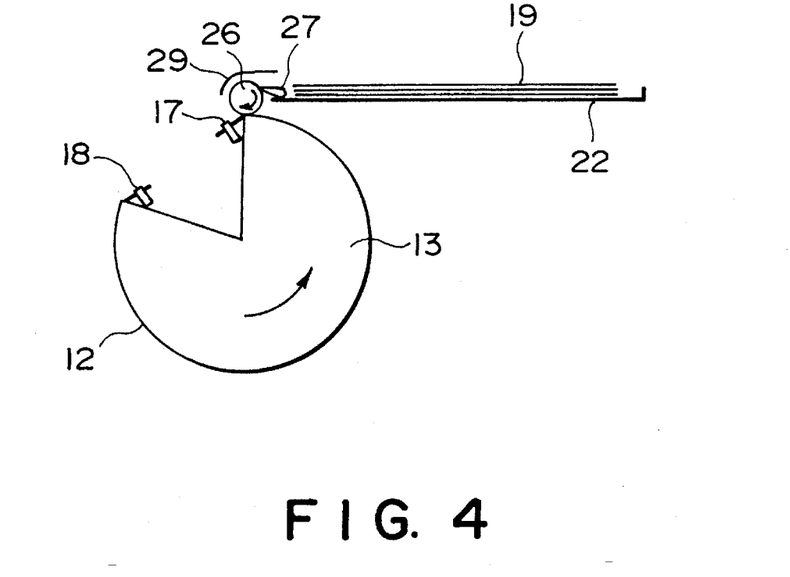
FIG. 4 is a partial view of another example of the peeling station of a printing apparatus as shown in FIG. 1.
Figure 5:
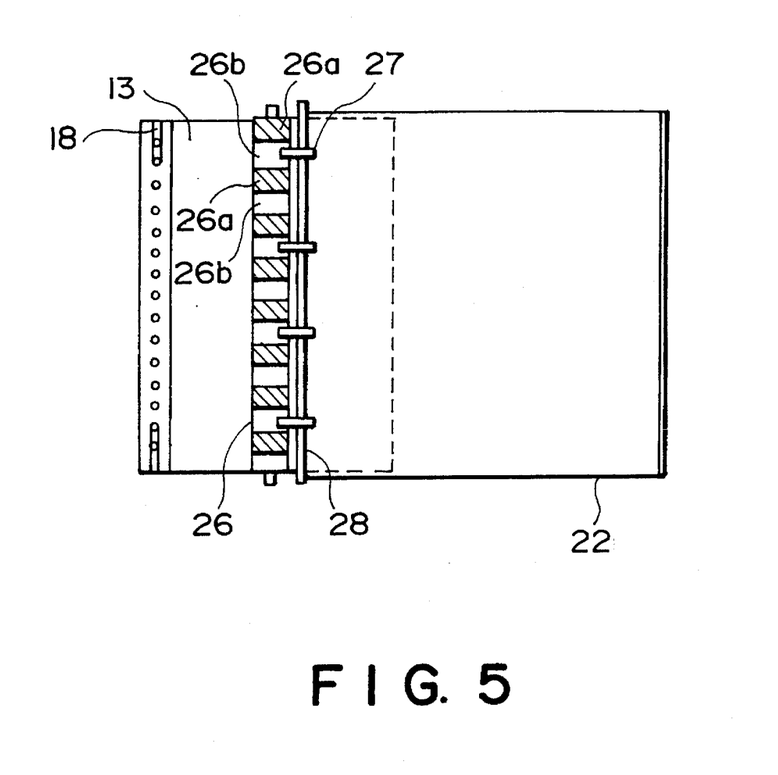
FIG. 5 is a plan view of the peeling station shown in FIG. 4.

It is possible to effect the peeling apart of the release film 19 by using a peeling roller 26 as shown in FIGS. 4 and 5. The peeling roller 26 has a peripheral surface provided alternately with adhesive parts 26a and non-adhesive parts 26b. Accordingly, the release film 19 contacting the adhesive parts are attached thereto and taken up along a guide 29 to be separated from the plate blank 12. The release film 19 attached to the adhesive parts 26a of the peeling roller 26 is peeled apart from the peeling roller 26 by means of separation claws 27 to be recovered in a recovery tray 22. The separation claws 27 are supported on a supporting bar 28 as shown in FIG. 5. The peeling roller 26 is disposed spaced apart from the plate cylinder 13 during the printing image forming step and the printing step and is caused to contact the release film 26 in the peeling step. Incidentally, the guide 29 is omitted from showing in FIG. 5.

In the embodiment shown in FIGS. 4 and 5, the peeling roller 26 is pressed against the plate blank, so that vibration of the plate blank 12 during the peeling can be minimized.

As described hereinabove, according to the printing method of the present invention, the release film is removed after affixing the photosensitive plate blank about the plate cylinder, so that a good printing plate with minimum damage or stain can be obtained and used to provide clear printed products. Further, as a machine exclusively used for peeling of the release film is not required, the printing apparatus can be made compact as a whole.

Hereinbelow, the present invention is explained more specifically based on Examples, wherein "parts" are by weight.

EXAMPLE 1

On one side of high quality paper comprising principally long-fiber pulp, well-sized, excellent in water resistance and smoothness and having a basis weight of 140 g/m$^2$ (with the other side treated with a polyester resin for improving the water resistance, a solution of the following composition was applied by a wire bar to form a hydrophilic layer in a dry thickness of 15 microns.

| | |
|---|---|
| 10%-Aqueous solution of polyvinyl alcohol ("GOSENOL NH-18" (trade name), mfd. by Nihon Gosei Kagaku Kogyo K.K.) | 10 part(s) |
| Colloidal silica ("SNOWTEX-O" (trade name), mfd. by Nissan Kagaku Kogyo K.K.) | 2.7 part(s) |
| Pentaerythritol triacrylate ("KAYARAD PET-30" (trade name), mfd. by Nihon Kayaku K.K.) | 0.4 part(s) |

Then, on a 9 micron-thick polyethylene terephthalate film ("LUMIRROR T" (trade name), mfd. by Toray K.K.), a solution of the following composition was applied by a wire bar to form a polymerization layer in a dry thickness of 2–3 microns except for a peripheral marginal width of 20 mm.

| | |
|---|---|
| Chlorinated rubber ("SUPERCHLON CR-5" (trade name), mfd. by Sanyo Kokusaku Pulp K.K.) | 5.0 part(s) |
| Oligoester acrylate ("ARONIX M630" (trade name), mfd. by Toa Gosei Kagaku Kogyo K.K.) | 3.5 part(s) |
| 2,4-Diethylthioxanthone ("KAYACURE DETX", mfd. by Nihon Kayaku K.K.) | 0.7 part(s) |
| Ethyl 4-dimethylaminobenzoate ("KAYACURE EPA", mfd. by Nihon Kayaku K.K.) | 0.7 part(s) |
| Hydroquinone monomethyl ether | 0.05 part(s) |
| Copper phthalocyanine pigment | 0.1 part(s) |
| Methyl ethyl ketone | 15 part(s) |
| Toluene | 15 part(s) |

The above coated sheets were superimposed on each other so that their hydrophilic layer and polymerization layer contacted each other and passed through a laminator heated at 50° C. at a nip pressure of 5 kg.f/cm² to obtain an A4-size printing plate blank.

The thus-obtained plate blank was incorporated in an apparatus as shown in FIG. 1 and affixed about a plate cylinder 13 so that its polyethylene terephthalate film faced outside and the longer sides thereof were fixed by affixing chucks 17 and 18. Further, a photomask was applied on the plate blank. Then, the plate cylinder 13 was rotated at a peripheral speed of 100 mm/sec, and simultaneously the plate blank was exposed for 15 sec by an optical unit 130 including an ultraviolet fluorescent lamp (30 watt) disposed 50 mm spaced apart from the plate blank. As shown, the printing apparatus included the plate cylinder 13, a blanket cylinder 15 and an impression cylinder 16 respectively having a diameter of 100 mm.

After the exposure by the optical unit 130, the polystyrene terephthalate film was peeled apart while the plate cylinder 13 was rotated at a peripheral speed of 100 mm/sec, and printing was performed at a printing speed of 120 A4-sheets/min by using a black ink ("BSD NEW RUBBER BLACK SILVER" (trade name), mfd. by Bunshodo K.K.) and deionized water as dampening water otherwise in the manner described hereinbefore, whereby clear printed products free from image disorder were obtained. The image quality did not change even after printing of 3000 sheets.

EXAMPLE 2

A polymerization layer was formed on a 6 micron-thick A4-size polyethylene terephthalate film (LUMMIROR T") in the same manner as in Example 1 and laminated with a 25 micron-thick polyethylene terephthalate film coated with a silicone release agent ("LUMIRROR SILICONE-COATED", mfd. by Toray K.K.).

| | |
|---|---|
| AgBr | 0.9 part(s) |
| Silver behenate | 5.0 part(s) |
| Behenic acid | 4.0 part(s) |
| Phthalazinone | 1.0 part(s) |
| 2-Methyl-4-(3,5-di-tert-butyl-4-hydroxybenzyl)-1-naphthol | 2.6 part(s) |
| Polyvinyl butyral ("ESLEC BM-2", mfd. by Sekisui Kagaku Kogyo K.K.) | 10 part(s) |
| Methyl ethyl ketone | 90 part(s) |
| Xylene | 50 part(s) |
| n-Butanol | 30 part(s) |

Then, in a darkroom, a solution of 0.001 part of a sensitizing dye compound of the formula shown below in 1.0 part of N,N-dimethylformamide was added to the above composition, and the resultant mixture was subjected to sufficient dissolution and dispersion by using a paint shaker to form an emulsion for a thermal development-type photosensitive layer. The emulsion was applied onto the above-mentioned 6 micron-thick polyethylene terephthalate film except for a peripheral marginal width of 20 mm by a wire bar to form a thermal development-type photosensitive layer in a dry thickness of 4–5 microns, which was then coated with a 2–3 micron-thick protective layer by applying a 10%-aqueous solution of polyvinyl alcohol "GOSENOL NH-17Q" (trade name), mfd. by Nihon Gosei Kagaku Kogyo K.K.) by means of a wire bar.

From the resultant laminate including the polymerization layer and the thermal development-type photosensitive layer, the silicone-coated polyethylene terephthalate film was peeled apart to expose the polymerization layer, which was then laminated with a hydrophilic layer formed on high quality paper separately prepared in the same manner as in Example so that the hydrophilic layer contacted the polymerization layer, thereby to form an A4-size plate blank.

The thus obtained plate blank was exposed imagewise to a laser beam from an He-Ne laser (power 5 mW) in a drum scan-type laser beam printer (mfd. by Abe Sekkei K.K.), followed by 10 sec of thermal development at 100° C.

The plate blank after the imagewise exposure and thermal development was incorporated in a printing apparatus as shown in FIG. 1 and affixed about a plate cylinder 13 so that its thermal development-type photosensitive layer faced outside and the longer sides of the plate blank were fixed by the affixing chucks 17 and 18.

Then, the plate blank 12 was subjected to whole-area exposure by using an optical unit 130 including a fluorescent lamp (15 W) having an emission peak wavelength at 380 nm disposed 10 mm spaced apart from the plate blank while the plate cylinder 13 was rotated at a peripheral speed of 6 mm/sec. As shown, the printing apparatus included the plate cylinder 13, a blanket cylinder 15 and an impression cylinder respectively having a diameter of 100 mm.

After the exposure by the optical unit 130, the polyethylene terephthalate film was peeled apart together with the thermal development-type photosensitive layer disposed thereon while the plate cylinder 13 was rotated at a peripheral speed of 50 mm/sec, and printing was performed by using the same printing speed, the same ink and the same dampening water as in Example 1 otherwise in the same manner as described hereinbefore, whereby clear printed products free from image disorder were obtained. The image quality did not change even after 3000 sheets of printing.

EXAMPLE 3

| | |
|---|---|
| Polyvinyl butyral resin ("ESLEC BL-2" (trade name), mfd. by Sekisui Kagaku Kogyo K.K.) | 1 part(s) |
| Trimethylolpropane triacrylate ("ARONIX M-309" (trade name), mfd. by Toa Gosei Kagaku Kogyo K.K.) | 1 part(s) |
| 2,4-Diethylthioxanthone ("KAYACURE EPA" (trade name), mfd. by Nihon Kayaku K.K.) | 0.1 part(s) |
| n-Butanol | 13 part(s) |

A liquid having the above composition was applied onto a 100 micron-thick A4-size polycarbonate film ("PANLITE" (trade name), mfd. by Teijin Kasei K.K.) by using a wire bar to form a polymerization layer in a dry thickness of 5–6 microns except for a peripheral marginal width of 20 mm. Separately, a release film was prepared by applying a 10%-aqueous solution of polyvinyl alcohol ("GOSENOL GL-05" (trade name), mfd. by Nihon Gosei Kagaku Kogyo) onto a 9 micron-thick polyester film to form a hydrophilic layer in a dry thickness of 2 microns. Then, the release film was laminated onto the polymerization layer so that the hydrophilic layer and the polymerization layer contacted each other, to form an A4-size surface-reforming type plate blank.

The polyester film side of the thus obtained plate blank was exposed for 60 sec through a mask having a printed image pattern comprising a light-transmissive part and a light-nontransmissive part on a polyester film by a fluorescent lamp having a fluorescent peak at a wavelength of 380 nm and disposed about 3 cm spaced apart from the plate blank while the plate blank was heated at 90° C. on a hotplate.

After completion of the exposure, the plate blank was incorporated in a printing apparatus as shown in FIG. 1 including a plate cylinder 13, a blanket cylinder 15 and an impression cylinder 16 respectively having a diameter of 100 mm and affixed about the plate cylinder 13.

Then, the release film was peeled apart while the plate cylinder 13 was rotated at a peripheral speed of 20 mm/sec, and printing was performed by using the same printing speed, the same ink and the same dampening water as in Example 1 otherwise in the same manner as described hereinbefore, whereby clear printed products free from image disorder were obtained. The image quality did not change even after printing of 3000 sheets.

EXAMPLE 4

| | |
|---|---|
| Copolymer of acrylonitrile and polypoxy alkylene monomer ($CH_2=C(CH_3)CO-(OCH_2CH_2)_{30}OCH_3$) in a weight ratio of 26:74 | 5 part(s) |
| Acrylic resin aqueous dispersion ("ACRYSET EX-14" (trade name), mfd. by Nihon Shokubai Kagaku Kogyo K.K. | 40 part(s) |
| Surfactant ("EMULGEN 909" (trade name), mfd. by Kao K.K.) | 10 part(s) |
| Dipentaerythritol hexaacrylate ("KAYARAD DPHA", (trade name), mfd. by Nihon Kayaku K.K.) | 34 part(s) |
| 2,4-Diethylthioxanthone ("KAYACURE DETX" (trade name), mfd. by Nihon Kayaku K.K.) | 0.5 part(s) |
| Ethyl 4-dimethylamionobenzoate ("KAYACURE EPA" (trade name), mfd. by Nihon Kayaku K.K.) | 0.5 part(s) |
| Butyl cellosolve | 10 part(s) |
| De-ionized water | 35 part(s) |

A liquid having the above composition was applied onto a 100 micron-thick polyester film ("LUMIRROR T") by a wire bar to form a polymerization layer in a dry thickness of 5–6 microns except for a peripheral marginal width of 20 mm. Separately, a release film was prepared by applying a fluorine-containing resin ("FLUORAD FC-721" (trade name), mfd. by Sumitomo 3M K.K.) by an applicator onto a 9 micron-thick polyester film ("LUMIRROR T") to form a water-repellent layer in a dry thickness of 2 microns. Then, the release film was laminated onto the polymerization layer so that the water repellent layer contacted the polymerization layer to form an A4-size surface-reforming-type plate blank.

The polyester film side of the thus obtained plate blank was exposed for 60 sec through a mask having a printed image pattern comprising a light-transmissive part and a light-nontransmissive part on a polyester film by a fluorescent lamp having a fluorescent peak at a wavelength of 380 nm and disposed about 3 cm spaced apart from the plate blank while the plate blank was heated at 50° C. on a hotplate.

After the exposure, the plate blank was incorporated in the same apparatus as in Example 3 and subjected to peeling of the release film and printing under the same conditions as in Example 3, whereby clear printed products free from image disorder were obtained. The image quality did not change even after 3000 sheets of printing.

What is claimed is:

1. A printing method comprising the steps of:

providing a photosensitive printing plate blank comprising a polymerization layer between a support and a release film, and a plate cylinder, having a peripheral cut, affixing the plate blank about the plate cylinder by fixing an end of the plate blank at the peripheral cut of the plate cylinder, so as to leave an end of the release film unfixed and separated from the fixed end of the plate blank, thereby facilitating peeling of the release film from the plate blank in a subsequent step, forming a pattern of a polymerized part and an unpolymerized part in the polymerization layer, peeling the release film apart from the plate blank affixed about the plate cylinder starting from the separated end of the release film, and removing the release film from the plate blank due to the rotating of the plate cylinder and peeling of the release film, thereby leaving a printing plate on the plate cylinder, and performing printing by using the printing plate, while said printing plate is on the plate cylinder.

2. A method according to claim 1 wherein, when the release film is peeled apart, the unpolymerized part of the polymerization layer is attached to and removed together with the release film and the polymerized part of the polymerization layer is left to form a printing pattern of the printing plate.

3. A method according to claim 1 wherein, when the release film is peeled apart, substantially all the polymerization layer is left on the support and a property of the release film is transferred selectively to the surface of the polymerized part of the polymerization layer to form a printing pattern of the printing plate.

4. A method according to claim 1, wherein said end of the release film separated from the plate blank at the time of affixing the plate blank about the peripheral cut of the plate cylinder is left unattached to the polymerization layer.

5. A printing method comprising the steps of:

providing a photosensitive printing plate blank comprising a polymerization layer having a pattern of a polymerized part and an unpolymerized part between a support and a release film, and a plate cylinder, having a peripheral cut, affixing the plate blank about the plate cylinder by fixing an end of the plate blank at the peripheral cut of the plate cylinder, so as to leave an end of the release film unfixed and separated from the fixed end of the plate blank, thereby facilitating peeling of the release film from the plate blank in a subsequent step, peeling the release film apart from the plate blank affixed about the plate cylinder starting from the separated end of the release film, and removing the release film from the plate blank due to the rotating of the plate cylinder and drawing of the release film, thereby leaving a printing plate on the plate cylinder, and performing printing by using the printing plate, while said printing plate is on the plate cylinder.

6. A method according to claim 5 wherein, when the release film is peeled apart, the unpolymerized part of the polymerization layer is attached to and removed together with the release film and the polymerized part of the polymerization layer is left to form a printing pattern of the printing plate.

7. A method according to claim 5 wherein, when the release film is peeled apart, substantially all the polymerization layer is left on the support and a property of the release film is transferred selectively to the surface of the polymerized part of the polymerization layer to form a printing pattern of the printing plate.

8. A method according to claim 5, wherein said end of the release film separated from the plate blank at the time of affixing the plate blank about the peripheral cut of the plate cylinder is left unattached to the polymerization layer.

9. A printing method comprising the steps of:

providing a photosensitive printing plate blank comprising a thermal development-type polymerization layer having a latent image therein between a support and a release film, and a plate cylinder having a peripheral cut, affixing the plate blank about the plate cylinder by fixing an end of the plate blank at the peripheral cut of the plate cylinder, so as to leave an end of the release film unfixed an separated from the fixed end of the plate blank, thereby facilitating peeling of the release film from the plate blank in a subsequent step, forming a pattern of a polymerized part and an unpolymerized part corresponding to the latent image in the polymerization layer, peeling the release film apart from the plate blank affixed about the plate cylinder, starting from the separated end of the release film, and removing the release film from the plate blank due to the rotating of the plate cylinder and peeling of the release film thereby leaving a printing plate on the plate cylinder, and performing printing by using the printing plate while said printing plate is on the plate cylinder.

10. A method according to claim 9 wherein, when the release film is peeled apart, the unpolymerized part of the polymerization layer is attached to and removed together with the release film and the polymerized part of the polymerization layer is left to form a printing pattern of the printing plate.

11. A method according to claim 9 wherein, when the release film is peeled apart, substantially all the polymerization layer is left on the support and a property of the release film is transferred selectively to the surface of the polymerized part of the polymerization layer to form a printing pattern of the printing plate.

12. A method according to claim 9, wherein said end of the release film separated from the plate blank at the time of affixing the plate blank about the peripheral cut of the plate cylinder is left unattached to the polymerization layer.

13. A printing method comprising the steps of:

providing a photosensitive printing plate blank comprising a polymerization layer between a support and a release film, a thermal development-type photosensitive layer having a latent image therein on the release film, and a plate cylinder having a peripheral cut affixing the plate blank about the plate cylinder by fixing an end of the plate blank at the peripheral cut of the plate cylinder, so as to leave an end of the release film unfixed and separated from the fixed end of the plate blank thereby facilitating peeling of the release film in a subsequent step, forming a pattern of a polymerized part and an unpolymerized part in the polymerization layer corresponding to the latent image in the photosensitive layer, peeling the release film apart from the plate blank affixed about the plate cylinder starting from the separated end of the release film, and removing the release film from the plate blank due to the rotating of the plate cylinder and peeling of the release film, thereby leaving a printing plate on the plate cylinder, and performing printing by using the printing plate while said printing plate is on the plate cylinder.

14. A method according to claim 13 wherein, when the release film is peeled apart, the unpolymerized part of the polymerization layer is attached to and removed together with the release film and the polymerized part of the polymerization layer is left to form a printing pattern of the printing plate.

15. A method according to claim 13 wherein, when the release film is peeled apart, substantially all the polymerization layer is left on the support and a property of the release film is transferred selectively to the surface of the polymerized part of the polymerization layer to form a printing pattern of the printing plate.

16. A method according to claim 13, wherein said end of the release film separated from the plate blank at the time of affixing the plate blank about the peripheral cut of the plate cylinder is left unattached to the polymerization layer.

* * * * *

UNITED STATES PATENT AND TRADEMARK OFFICE
CERTIFICATE OF CORRECTION

PATENT NO. : 5,533,452
DATED : July 9, 1996
INVENTORS : AKIHIKO MOURI ET AL.

It is certified that error appears in the above-identified patent and that said Letters Patent is hereby corrected as shown below:

ON THE COVER PAGE, item

AT [56] REFERENCES CITED

Foreign Patent Documents, "5550246  4/1990 Japan" should read --55-50246 4/1980 Japan.--.

COLUMN 2

Line 19,  "perform" should read --performing--;
Line 30,  "perform" should read --performing--.

COLUMN 4

Line 9,   "by-means" should read --by means--;
Line 12,  "hydrophillic" should read --hydrophilic--;
Line 44,  "hydrophillic" should read --hydrophilic--.

COLUMN 5

Line 57,  "dichlorothixanthone," should read --dichlorothioxanthone,--.

UNITED STATES PATENT AND TRADEMARK OFFICE
CERTIFICATE OF CORRECTION

PATENT NO. : 5,533,452

DATED : July 9, 1996

INVENTORS : AKIHIKO MOURI ET AL.

Page 2 of 4

It is certified that error appears in the above-identified patent and that said Letters Patent is hereby corrected as shown below:

COLUMN 6

Line 37,  "nonpolymerization" should read --non-polymerization--;

Line 51,  "polymerization-nonpolymerization-- should read --polymerization-non-polymerization--.

COLUMN 7

Line 17,  "general.," should read --general,--.

COLUMN 8

Line 5,   "aminonaphtols" should read --aminonaphthols,--;

Line 46,  "1naphthol," should read --1-naphthol,--;

Line 51,  "case" should read --the case--.

UNITED STATES PATENT AND TRADEMARK OFFICE
CERTIFICATE OF CORRECTION

PATENT NO. : 5,533,452

DATED : July 9, 1996

INVENTORS : AKIHIKO MOURI ET AL.

It is certified that error appears in the above-identified patent and that said Letters Patent is hereby corrected as shown below:

COLUMN 10

Line 25,   "per" should read --per se--.

COLUMN 11

Line 54,   "cylinder 13.." should read --cylinder 13.--;
   Line 58,   "the," should read --the--.

COLUMN 14

Line 45,   "Example" should read --Example 1--.

COLUMN 16

Line 25,   "water repellent" should read --water-repellent--.
   Line 47,   "cylinder," shoulder read --cylinder--.

UNITED STATES PATENT AND TRADEMARK OFFICE
CERTIFICATE OF CORRECTION

PATENT NO. : 5,533,452

DATED : July 9, 1996

INVENTORS : AKIHIKO MOURI ET AL.

It is certified that error appears in the above-identified patent and that said Letters Patent is hereby corrected as shown below:

COLUMN 17

Line 19,   "cylinder," should read --cylinder--;
   Line 31,   "drawing" should read --peeling--;
   Line 61,   "an" should read --and--.

COLUMN 18

Line 5,    "film" should read --film,--;
   Line 30,   "cut" should read--cut,--.

Signed and Sealed this

Seventeenth Day of December, 1996

Attest:

BRUCE LEHMAN

Attesting Officer     Commissioner of Patents and Trademarks